United States Patent
Tu et al.

(10) Patent No.: US 7,342,835 B2
(45) Date of Patent: Mar. 11, 2008

(54) MEMORY DEVICE WITH PRE-FETCH CIRCUIT AND PRE-FETCH METHOD

(75) Inventors: Ying Te Tu, Hsinchu (TW); Yu Chang Lin, Hsinchu (TW)

(73) Assignee: Winbond Electronics Corp., Hsinchu (TW)

( * ) Notice: Subject to any disclaimer, the term of this patent is extended or adjusted under 35 U.S.C. 154(b) by 111 days.

(21) Appl. No.: 11/105,459

(22) Filed: Apr. 14, 2005

(65) Prior Publication Data

US 2006/0233013 A1 Oct. 19, 2006

(51) Int. Cl.
- G11C 7/10 (2006.01)
- G11C 11/34 (2006.01)
- G11C 16/06 (2006.01)
- G11C 7/00 (2006.01)

(52) U.S. Cl. .................... 365/189.05; 365/185.25; 365/220; 365/222

(58) Field of Classification Search ............. 365/100, 365/189.05, 185.25, 222, 220
See application file for complete search history.

(56) References Cited

U.S. PATENT DOCUMENTS

| | | | | |
|---|---|---|---|---|
| 5,253,211 A * | 10/1993 | Suzuki | ................ | 365/222 |
| 5,835,446 A | 11/1998 | Park | | |
| 6,005,818 A * | 12/1999 | Ferrant | ................ | 365/222 |
| 6,130,852 A * | 10/2000 | Ohtani et al. | ........ | 365/230.03 |
| 6,134,169 A * | 10/2000 | Tanaka | ................ | 365/222 |
| 6,198,682 B1 * | 3/2001 | Proebsting | ............ | 365/207 |
| 6,215,706 B1 * | 4/2001 | Harrand et al. | ....... | 365/189.05 |
| 6,256,248 B1 * | 7/2001 | Leung | ................ | 365/222 |
| 6,337,810 B1 * | 1/2002 | Yamasaki et al. | ...... | 365/189.05 |
| 6,418,063 B1 * | 7/2002 | Seitsinger et al. | ..... | 365/189.05 |
| 6,519,719 B1 * | 2/2003 | Manning | ............ | 714/42 |
| 7,113,419 B2 * | 9/2006 | Chow | ................ | 365/145 |
| 7,123,542 B2 * | 10/2006 | Fekih-Romdhane et al. | ..... | 365/236 |
| 2001/0046176 A1 | 11/2001 | Sohn et al. | | |
| 2002/0031039 A1 | 3/2002 | Suzuki | | |

* cited by examiner

*Primary Examiner*—Richard T. Elms
*Assistant Examiner*—Allison P Bernstein
(74) *Attorney, Agent, or Firm*—Finnegan, Henderson, Farabow, Garrett & Dunner LLP (57) ABSTRACT

A memory device includes plural memory blocks, each memory block having memory cells arranged in wordlines and bitlines and a selector to select a wordline of memory cells. A group of first sense amplifiers are coupled to each memory block to at least one of read data from and write data to the selected wordline. A buffer of latches are coupled to the group of first sense amplifiers and have sufficient capacity to hold data corresponding to the selected wordline of memory cells.

20 Claims, 7 Drawing Sheets

MEMORY DEVICE WITH PRE-FETCH CIRCUIT AND PRE-FETCH METHOD

DESCRIPTION OF THE INVENTION

1. Field of the Invention

This invention is in general related to a memory device having a pre-fetch circuit within it and a pre-fetch method and, more particularly, to a memory device and pre-fetch method that reduce current consumption and memory refresh rate.

2. Background of the Invention

Conventional Dynamic Random Access Memory (DRAM) devices consist of plural memory blocks, each containing memory cells for storing data. The memory cells may be arranged in rows and columns. Typically, a wordline is associated with each row of memory cells in each memory block and a pair of bitlines is associated with each column of memory cells. A bitline pair consists of two data lines, one for carrying the bit and the other for carrying its logical inverse. Each memory cell may be accessed by its associated wordline and bitline pair.

For a memory read operation, a wordline is first selected and data is read from memory cells in the selected wordline to bitline pairs. A bitline pair feeds into a first sense amplifier, which senses a small voltage difference between the bitline and the corresponding inverse of the bitline and amplifies the small voltage difference. A set of second sense amplifiers coupled to the memory device amplify the outputs of the first sense amplifiers a second time and send the twice amplified data to an output line such as a DQ input/output bus. To write data into the memory, the data traverses the same path in reverse. With such a configuration, the amount of data that can be read or written during one access is limited by the number of second sense amplifiers.

In addition to read and write operations, a DRAM device refreshes the contents of memory cells by periodically selecting wordlines. However, because wordlines in the same memory block share the same first sense amplifiers, only one wordline in a memory block may be selected at a time. For example, if a first wordline is selected for a read operation, then a second wordline in the same memory block cannot be selected for a refresh. The first wordline must be deselected while the second wordline is refreshed, then the first wordline may be selected again to continue the read operation. Thus, a read or write operation may require repeated selection of a wordline in order to allow for periodic refreshing of data. Repeatedly selecting or powering a wordline on and off results in large current consumption, and hence a large power consumption, and affects operations of neighboring memory cells by increasing a current leakage in such neighboring memory cells. Consequently, the frequent refresh required to maintain the data of memory cells inhibits the attainment of a low power memory.

If data is to be pre-fetched, buffers are commonly added after the second sense amplifiers to increase the speed of inputting and outputting data. Consequently, a two-level, four-level, or even higher level pre-fetch circuit is formed. However, regardless of the size of any pre-fetch circuit, if the read or write operation of a single wordline is effected, that wordline is selected and deselected repeatedly to allow for refresh operations on other wordlines during the read or write operation.

It would therefore be desirable to reduce the number of times a wordline is powered on and off during a read or a write operation and thereby conserve power and decrease current leakage.

SUMMARY OF THE INVENTION

A memory device consistent with the present invention includes a first memory block having memory cells arranged in rows and columns; a selector coupled to the first memory block to select a row of the memory cells; a group of amplifiers coupled to the first memory block to at least one of read data from and write data to the selected row; and a buffer of latches coupled to the group of amplifiers and having sufficient capacity to hold data corresponding to the selected row of memory cells.

In a method, consistent with the present invention, for reading data from a memory block, a row of memory cells in the memory block may be selected. Next, data stored in the selected row of memory cells may be transferred, in a single operation, to a group of latches. Finally, the transferred data may be held in the group of latches.

In another method consistent with the present invention, for writing data to a memory block, a row of memory cells may be selected to receive data. Next, currently held data may be read from the memory cells of the selected row to a group of latches. Data may then be transferred from an input line to at least one latch of the group of latches. Finally, the data held in the group of latches may be transferred, in a single operation, to the selected row of memory cells.

Additional features and advantages of the invention will be set forth in part in the description which follows, and in part will be obvious from the description, or may be learned by practice of the invention. The features and advantages of the invention will be realized and attained by means of the elements and combinations particularly pointed out in the appended claims.

It is to be understood that both the foregoing general description and the following detailed description are exemplary and explanatory only and are not restrictive of the invention, as claimed.

The accompanying drawings, which are incorporated in and constitute a part of this specification, illustrate several embodiments of the invention and, together with the description, serve to explain the principles of the invention.

DESCRIPTION OF THE EMBODIMENTS

Reference will now be made in detail to the exemplary embodiments of the invention, which are illustrated in the accompanying drawings. Wherever possible, the same reference numbers will be used throughout the drawings to refer to the same or like parts.

Figure 1:
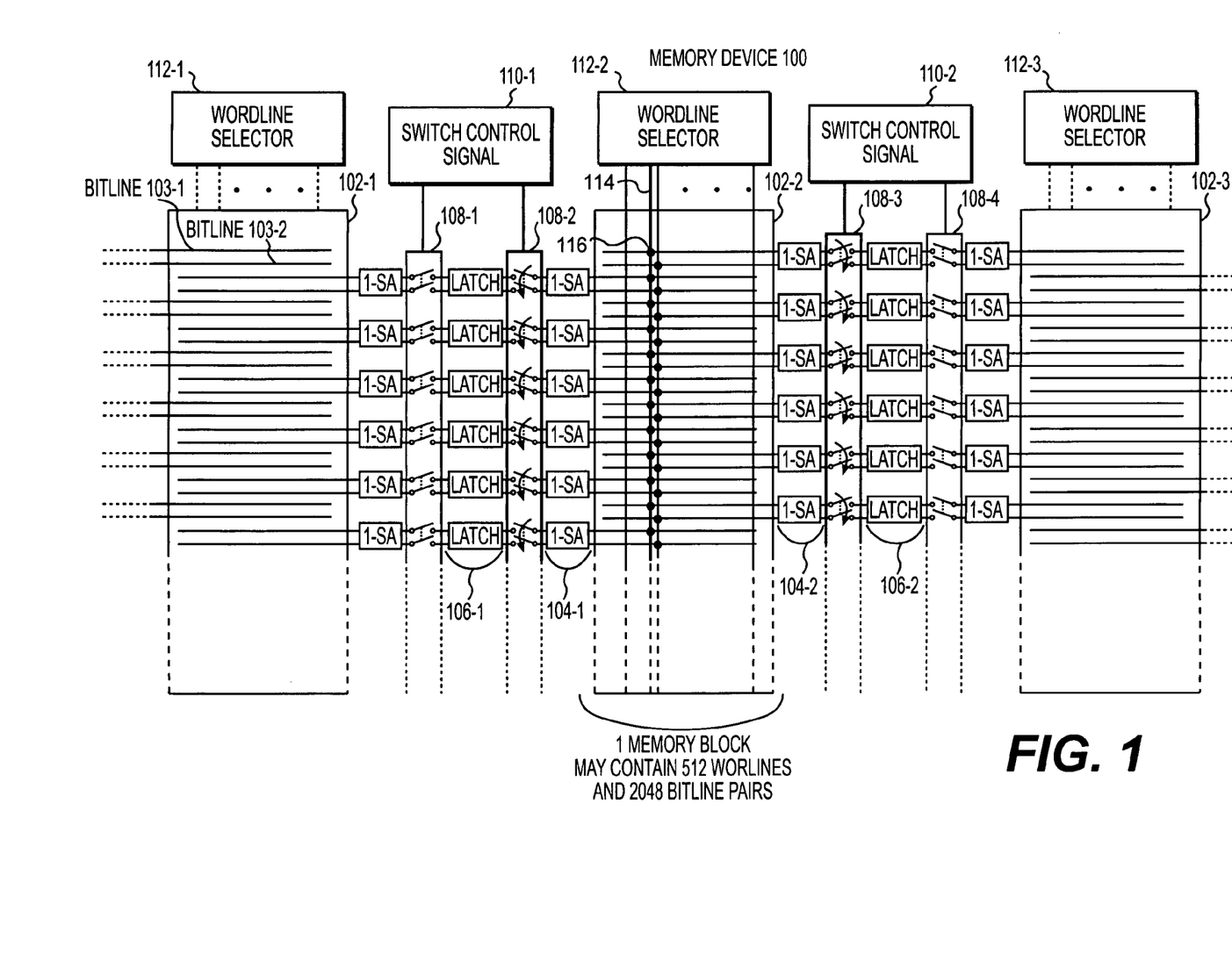
FIG. 1 is a memory device consistent with the present invention.
Figure 3:
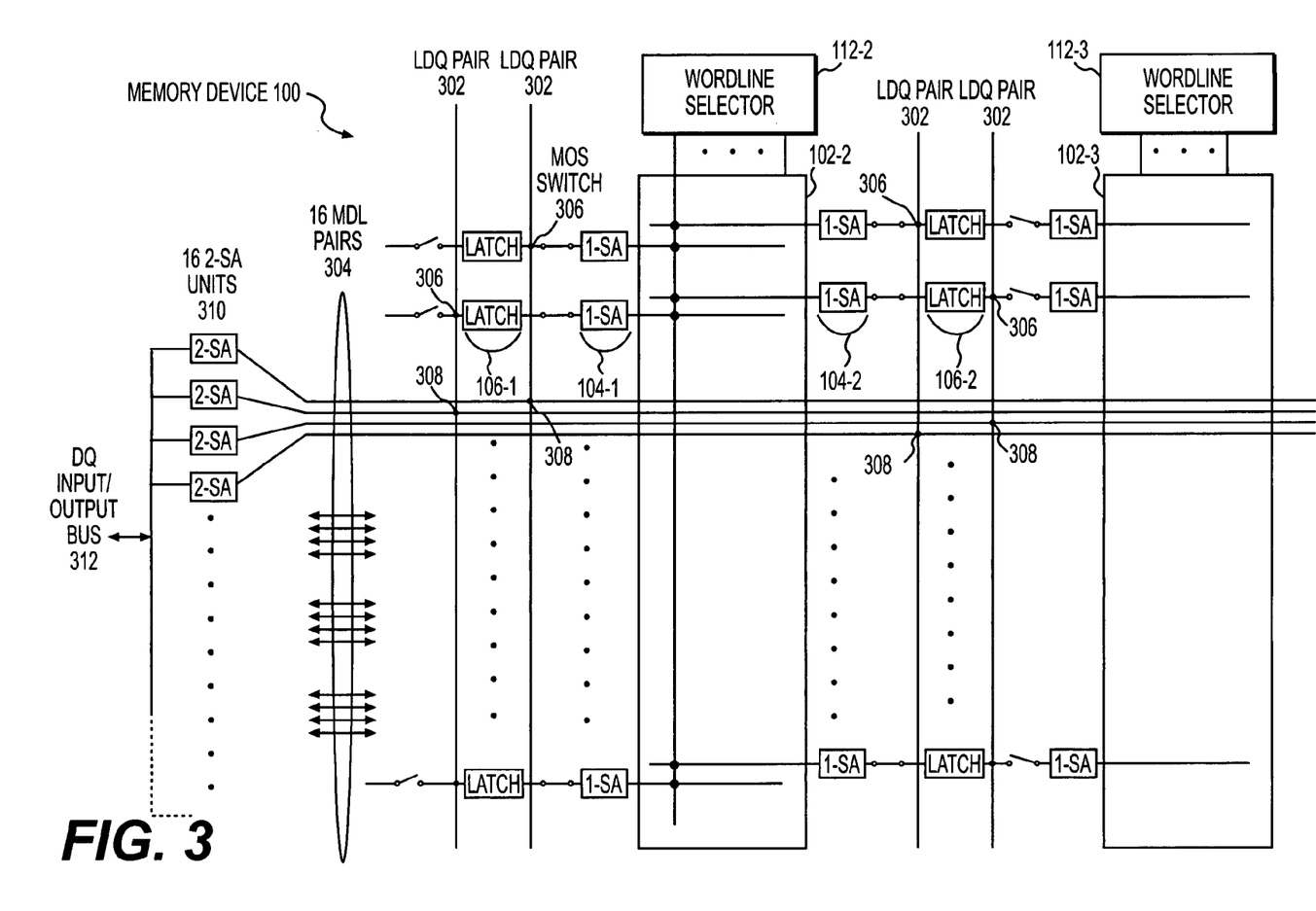
FIG. 3 is another view of the memory device shown in FIG. 1.

In FIG. 1, an exemplary memory device consistent with the present invention is shown. Memory device 100 includes plural memory blocks 102-1 102-2, and 102-3, each memory block including plural memory cells arranged in rows and columns. FIGS. 1 and 3 herein depict rows and columns vertically and horizontally, respectively. Wordlines are respectively associated with the rows of memory cells and bitline pairs are respectively associated with columns of memory cells. Bitline pairs 103 can be coupled to each memory cell within memory blocks 102-1 102-2, and 102-3. Bitline pairs 103 each include two data lines, one bitline 103-1 for carrying a bit stored in an associated memory cell, and the other bitline 103-2 for carrying a logical inverse of the bit carried on bitline 103-1, thereby acting as a differential reference during sensing. For example, depending on the polarity of a memory cell being accessed (e.g., high or low), one of bitlines 103-1 and 103-2 will be at a high voltage level and the other at a low voltage level. Each successive bitline pair 103 is configured to be coupled to a first sense amplifier at an end thereof opposite to the end of the bitline pair 103 immediately on each side thereof, as shown in FIG. 1. Thus, banks of first sense amplifiers ("1-SA") 104 associated with memory block 102-2 are disposed on both left and right sides (as viewed in FIG. 1) of memory block 102-2 to form a left bank of first sense amplifiers 104-1 and a right bank of first sense amplifiers 104-2. First sense amplifiers 104-1 are coupled to alternate bitline pairs 103 and first sense amplifiers 104-2 are coupled to the bitline pairs 103 between the alternate bitline pairs to which first sense amplifiers 104-1 are coupled. A buffer, consisting of banks of latches 106, for example, is coupled to left bank of first sense amplifiers 104-1 and right bank of first sense amplifiers 104-2. More particularly, a left bank of latches 106-1 is coupled to left bank of first sense amplifiers 104-1 and is further shared between center memory block 102-2 and a second memory block 102-1 to the left of center memory block 102-2, as shown in FIG. 1. Similarly, a right bank of latches 106-2 is coupled to right bank of first sense amplifiers 104-2 and is further shared between center memory block 102-2 and a third memory block 102-3 to the right of center memory block 102-2, as shown in FIG. 1.

Left banks of switches 108-1, 108-2 are provided to selectively couple left bank of latches 106-1 to first sense amplifiers 104 associated with memory block 102-1 and memory block 102-2, respectively. Similarly, right bank of switches 108-3 and 108-4 are provided to selectively couple right bank of latches 106-2 to first sense amplifiers 104 associated with memory block 102-2 and memory block 102-3, respectively. A switch controller 110-1 generates a switch control signal to control operation of banks of switches 108-1 and 108-2. A switch controller 110-2 similarly controls operation of banks of switches 108-3 and 108-4. In FIG. 1, switch controller 110-1 is shown turning on bank of switches 108-2 in order to couple left bank of first sense amplifiers 104-1 to latches 106-1, and switch controller 110-2 is shown turning on a bank of switches 108-3 in order to couple right bank of first sense amplifiers 104-2 to latches 106-2.

Each memory block is provided with a wordline selector 112 for selecting a wordline associated with a row of memory cells to be written to or read from. For example, wordline selectors 112-1, 112-2, and 112-3 are provided for selecting wordlines in memory blocks 102-1, 102-2, and 102-3, respectively. In FIG. 1, wordline selector 112-2 is shown selecting a wordline 114 (bold line) in memory block 102-2 and thereby selecting memory cells 116 (shown as dots). First sense amplifiers 104-1 and 104-2 are coupled to associated bitline pairs, which are in turn coupled to selected memory cells 116 associated with selected wordline 114. As described above, bitlines pairs 103-1 and 103-2 are designed to serve as differential references to each other during sensing. Thus, regardless of the contents of memory cells associated with a neighboring unselected wordline (e.g., the wordline immediately to the right of selected wordline 114), the bitlines pairs in memory block 102-2 will provide differential readings of the respective memory cells associated with the selected wordline (e.g., wordline 114). Input and output lines, such as Local DQ (LDQ) lines and Main Data Lines (MDLs), further described below with respect to FIG. 3, may be coupled to bitline pairs 103 on either side of latches 106 to provide a means for transferring data between the memory cells and a DQ input/output bus. The configuration and operation of LDQ lines, MDLs, and a DQ input/output bus are explained in greater detail with reference to FIG. 3.

Figure 2:
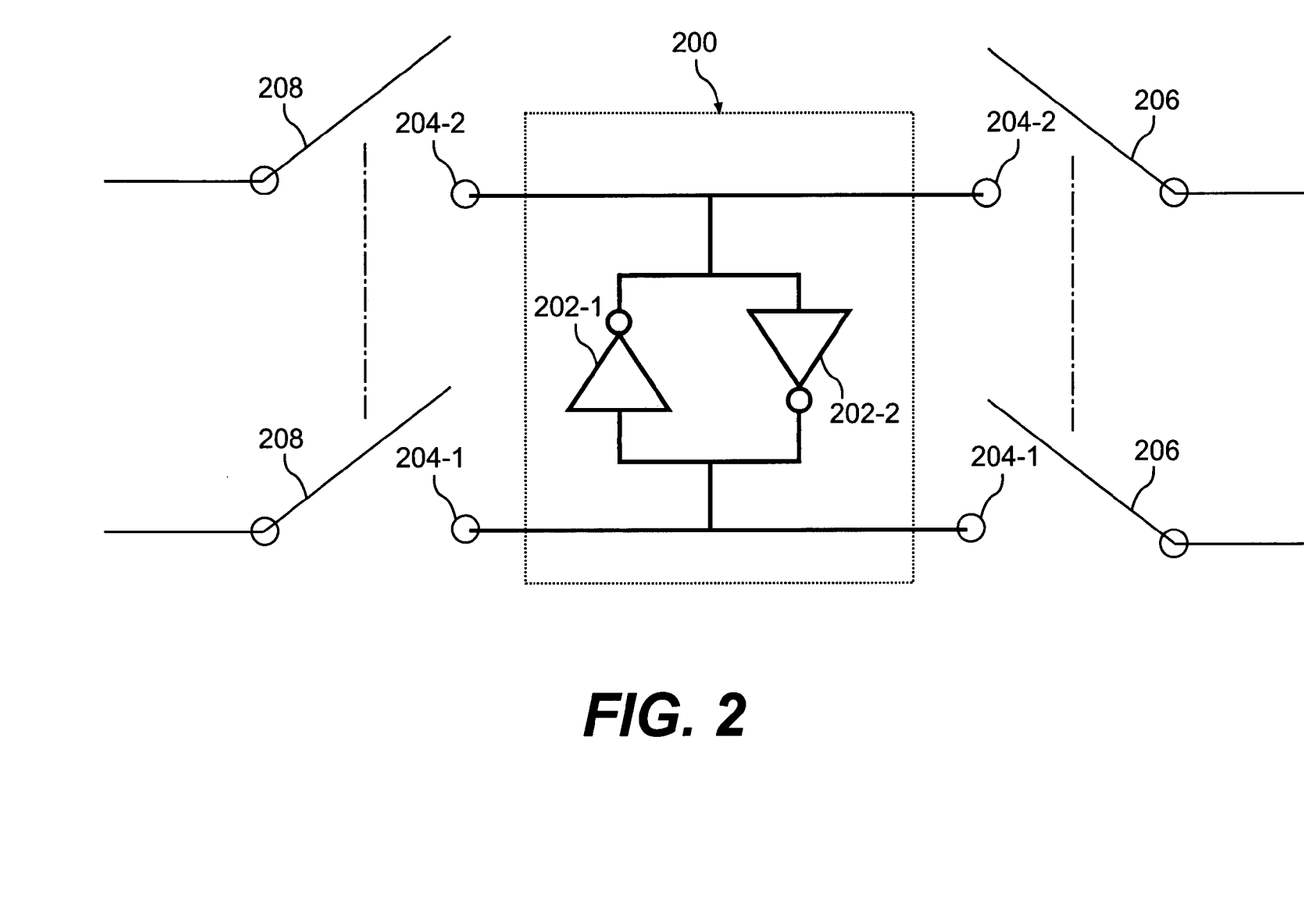
FIG. 2 is a latch of the memory device shown in FIG. 1.

FIG. 2 illustrates an exemplary embodiment of a latch 200 corresponding to a single one of the latches 106 in FIG. 1. Latch 200 includes two inverters 202-1 and 202-2 and two ports 204-1 and 204-2, ports 204-1 and 204-2 correspond to bitline pairs on either side of latch 200. Port 204-1 is coupled to an input of inverter 202-1 and to an output of inverter 202-2. Port 204-2 is coupled to an output of inverter 202-1 and to an input of inverter 202-2. As an example, assuming exemplary latch 200 corresponds to one of latches 106-1 shown in FIG. 1, ports 204-1 and 204-2 shown in FIG. 2 are selectively coupled to either a right pair of switches 108-2 or a left pair of switches 108-1, in accordance with the selection of switch controller 110-1. In this manner, latch 200 may be coupled to either memory block 102-2 or memory block 102-1, as explained above in reference to FIG. 1.

FIG. 3 depicts another view of memory device 100 in order to show the read and write paths. In addition to the components described in FIG. 1, memory device 100 includes LDQ pairs 302, MDL pairs 304, and MOS switches 306 and 308. For simplification of illustration, bitline pairs 103, LDQ pairs 302, and MDL pairs 304 are depicted as single lines although they each consist of a pair of lines, one line for a bit of data and the other for its inverse. In addition, for simplification of illustration, only a few latches 106 and first sense amplifiers 104 are shown in FIG. 3. LDQ pairs 302 are coupled to latches 106 via MOS switches 306. MDL pairs 304 are coupled to LDQ pairs 302 via MOS switches 308 and are coupled to second sense amplifiers ("2-SA") 310. Second sense amplifiers 310 are coupled to a DQ input/output bus 312. In the illustrated embodiment, DQ input/output bus 312 consists of sixteen lines. Thus there are sixteen second sense amplifiers 310 and sixteen MDL pairs 304 so that sixteen latches 106 can be read out to DQ input/output bus 312 in a single operation.

To implement a read operation, a wordline in memory block 102-2 is selected for reading. Data from memory cells of the selected wordline is read through left and right banks of first sense amplifiers 104-1 and 104-2 into left and right banks of latches 106-1 and 106-2, respectively, in a single simultaneous operation. The selected wordline may then be deselected. Next, at least a portion of the data stored in latches 106-1, 106-2 is read out to second sense amplifiers 310 and then to DQ input/output bus 312.

To implement the process of reading out at least a portion of data to second sense amplifiers 310, MOS switches 306 may be used to transfer data from a set of four latches, consisting of two latches 106-1 and two latches 106-2, shown in the upper portion of FIG. 3, to four LDQ pairs 302. Another set of four MOS switches 308 may then be used to connect the four LDQ pairs 302 to four MDL pairs 304. The selection of which MOS switches 306, 308 to turn on may be carried out by a column select line (not shown). MDL pairs 304 then transfer the data to second sense amplifiers 310, which transfer the data to DO input/output bus 312. In a similar manner, data from other sets of four latches associated with the selected wordline may also be transferred to DO input/output bus 312. The process of transferring data from latches 106-1, 106-2 to DO input/output bus 312 may repeat in order to read out any specified portion of the data stored in latches 106-1, 106-2. Because the data is first transferred to latches 106-1, 106-2, ongoing refresh operations will not interfere with or disrupt the read operation. Thus, while the process of transferring data from latches 106-1, 106-2 is carried out, the selected wordline, or other wordlines in memory block 102-2 and neighboring memory blocks, such as memory block 102-3, may be selected for refresh operations.

To implement a write operation, the sequence of steps is reversed. However, it may be desirable to perform a write operation on only a portion of a target wordline in memory block 102-2. Thus, a read operation may first be performed in order to transfer the data from the memory cells associated with the entire target wordline in memory block 102-2 to latches 106-1, 106-2. This preliminary read operation ensures preservation of any portion of data in the selected wordline that will not be affected by the write operation.

After the preliminary read operation, data is written to at least a portion of left and right banks of latches 106-1, 106-2. In the embodiment shown, data is written to sixteen of latches 106-1, 106-2 at one time, due to the sixteen-bit width of DQ input/output bus 312. The process of transferring data to latches 106-1, 106-2 may repeat as necessary in order to transfer a specified amount of data to be written. Once a specified amount of data has been transferred to at least a portion of latches 106-1, 106-2, the target wordline in memory block 102-2 is selected again to receive the data stored in latches 106-1, 106-2. Data is then written in a single operation from latches 106-1, 106-2 to the memory cells of the selected wordline through first sense amplifiers 104-1, 104-2. Any portion of latches 106-1, 106-2 that did not receive data during the process of transferring data to latches 106-1, 106-2 will rewrite the data that was read during the preliminary read operation. Thus, the present embodiment advantageously permits selection of the same wordline, or other wordlines in memory block 102-2 and neighboring memory blocks, such as memory block 102-3, for refresh operations while data is transferred to latches 106-1, 106-2.

Figure 4:
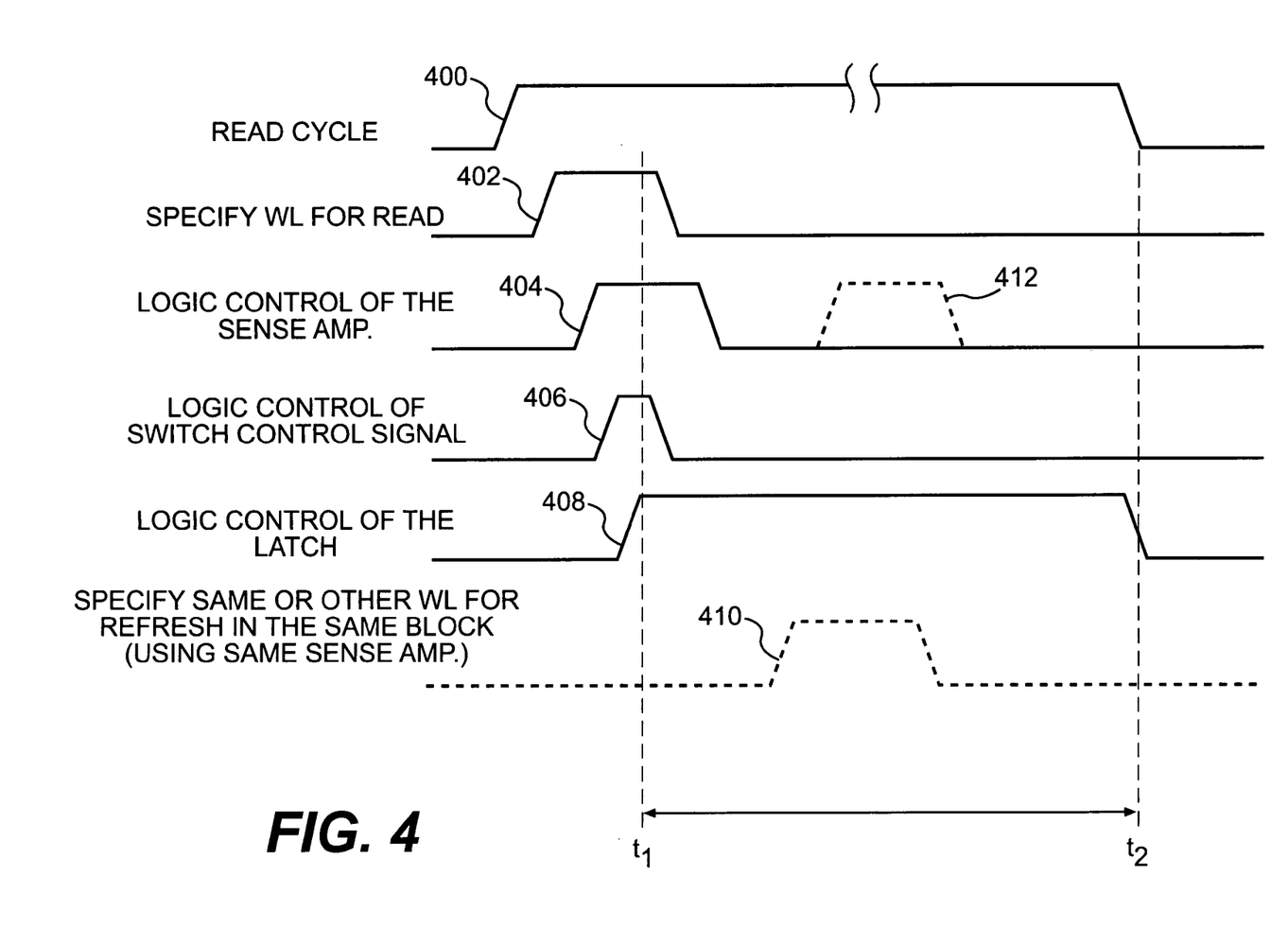
FIG. 4 is a read timing diagram consistent with the present invention.

FIG. 4 depicts an exemplary read cycle timing diagram for performing a read cycle on memory block 102-2. A read cycle signal 400 enables the read cycle. Referring also to FIG. 1, wordline selector 112-2 selects a wordline in memory block 102-2 for reading. A control signal 402 selects a wordline. Next, a control signal 404 initiates powering on left bank of first sense amplifiers 104-1 and right bank of first sense amplifiers 104-2 associated with memory block 102-2. A control signal 406 initiates operation of switch controllers 110-1 and 110-2 for coupling first sense amplifiers 104-1 and 104-2 to latches 106-1 and 106-2, respectively. A control signal 408 operates latches 106-1 and 106-2 to store the data being read. Between time t1 and time t2, latches 106-1 and 106-2 are read out to DQ input/output bus 312 in a series of operations as explained above with reference to FIG. 3. Depending on the amount of data to be read, data may be continuously read out from latches 106-1, 106-2. While data is read out continuously, first sense amplifiers 104-1, 104-2 may be powered on, and wordline selector 112-2 may select either another wordline, or the same wordline, in memory block 102-2, to be refreshed, as shown by a signal 410 and a signal 412.

Figure 5:
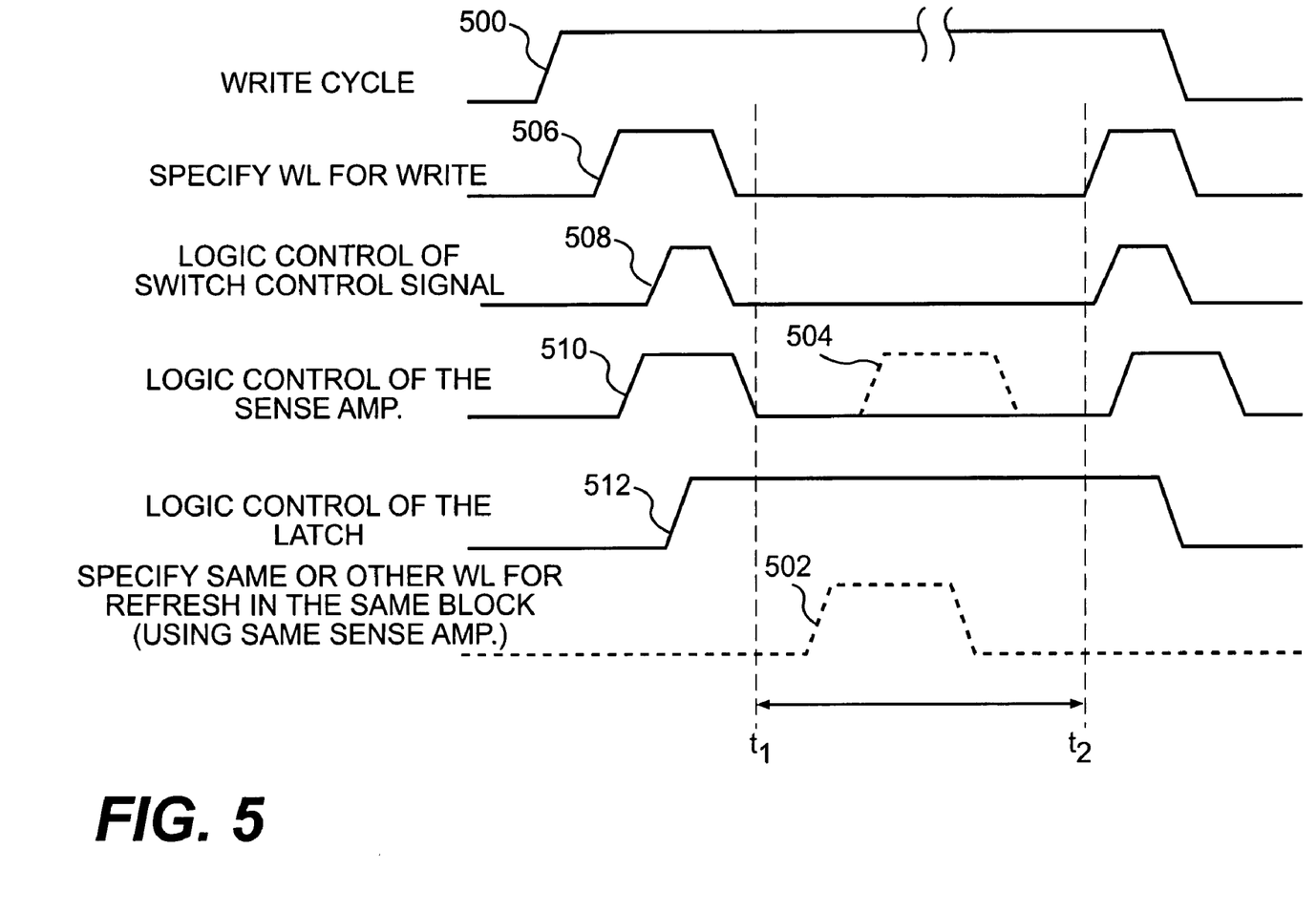
FIG. 5 is a write timing diagram consistent with the present invention.

FIG. 5 depicts an exemplary write cycle timing diagram for performing a write cycle on memory block 102-2. A write cycle signal 500 enables the write cycle. A preliminary read operation, as explained above in reference to FIG. 3, may be performed before time to in order to transfer the data from the memory cells associated with the entire target wordline to latches 106-1, 106-2. Between time t1 and time t2, new data to be written to memory is transferred from DQ input/output bus 312 for storing into ones of latches 106-1, 106-2. More particularly, the new data from DQ input/output bus 312 replaces the preliminarily transferred data held in the ones of latches 106-1, 106-2 corresponding to memory cells into which the new data is to be written. Thus, in the event new data is to be written to fewer than all of the memory cells associated with the target wordline, the ones of latches 106-1, 106-2 associated with memory cells that will not be written to will continue to hold the data received during the preliminary read operation. While data may be continuously stored into latches 106-1 and 106-2, wordline selector 112-2 may select a wordline in memory block 102-2 to be refreshed, as shown by signals 502 and 504 (between time t1 and t2). After latches 106-1 and 106-2 have received the new data to be written (i.e., after time t2), wordline selector 112-2 may select the target wordline in memory block 102-2 to receive the data, as shown by a signal 506. The target wordline may be the same wordline that was refreshed or another wordline in memory block 102-2. A signal 508 initiates switch controllers 110-1 and 110-2 for coupling first sense amplifiers 104-1 and 104-2 to latches 106-1 and 106-2, respectively. Next, a signal 510 powers on left bank of first sense amplifiers 104-1 and right bank of first sense amplifiers 104-2 associated with memory block 102-2. Data may then be written in a single operation from latches 106-1 and 106-2 to the selected wordline in memory block 102-2. The signals appearing after time t2 may be repeated in order to select additional wordlines to receive a copy of the same data, thereby reducing time for carrying out an optional memory test.

Figure 6:
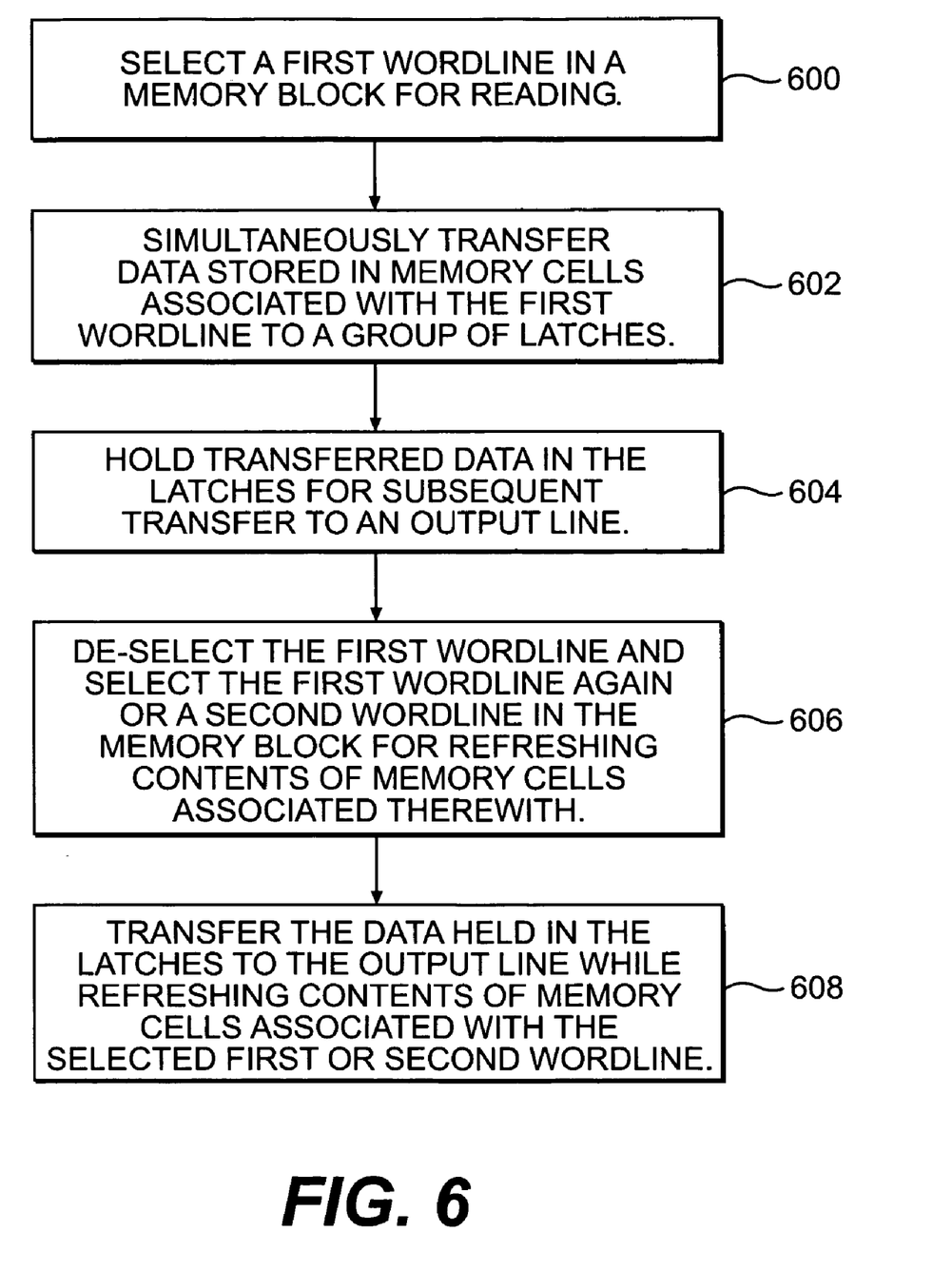
FIG. 6 is a flowchart illustrating a method for reading data from a memory device consistent with the present invention.

FIG. 6 is a flowchart illustrating a method consistent with the present invention for reading data from a memory block. In step 600, a first wordline in the memory block is selected for reading. In step 602, data stored in memory cells associated with the first wordline is simultaneously transferred to a group of latches. In step 604, the transferred data is held in the latches for subsequent transfer to an output line. In step 606, the first wordline is de-selected and a second wordline is selected for refreshing its contents. In addition, the first wordline may be selected again for refreshing. In step 608, the data in the latches is transferred to an output line while the contents of the memory cells associated with the first or second wordline may be refreshed.

Figure 7:
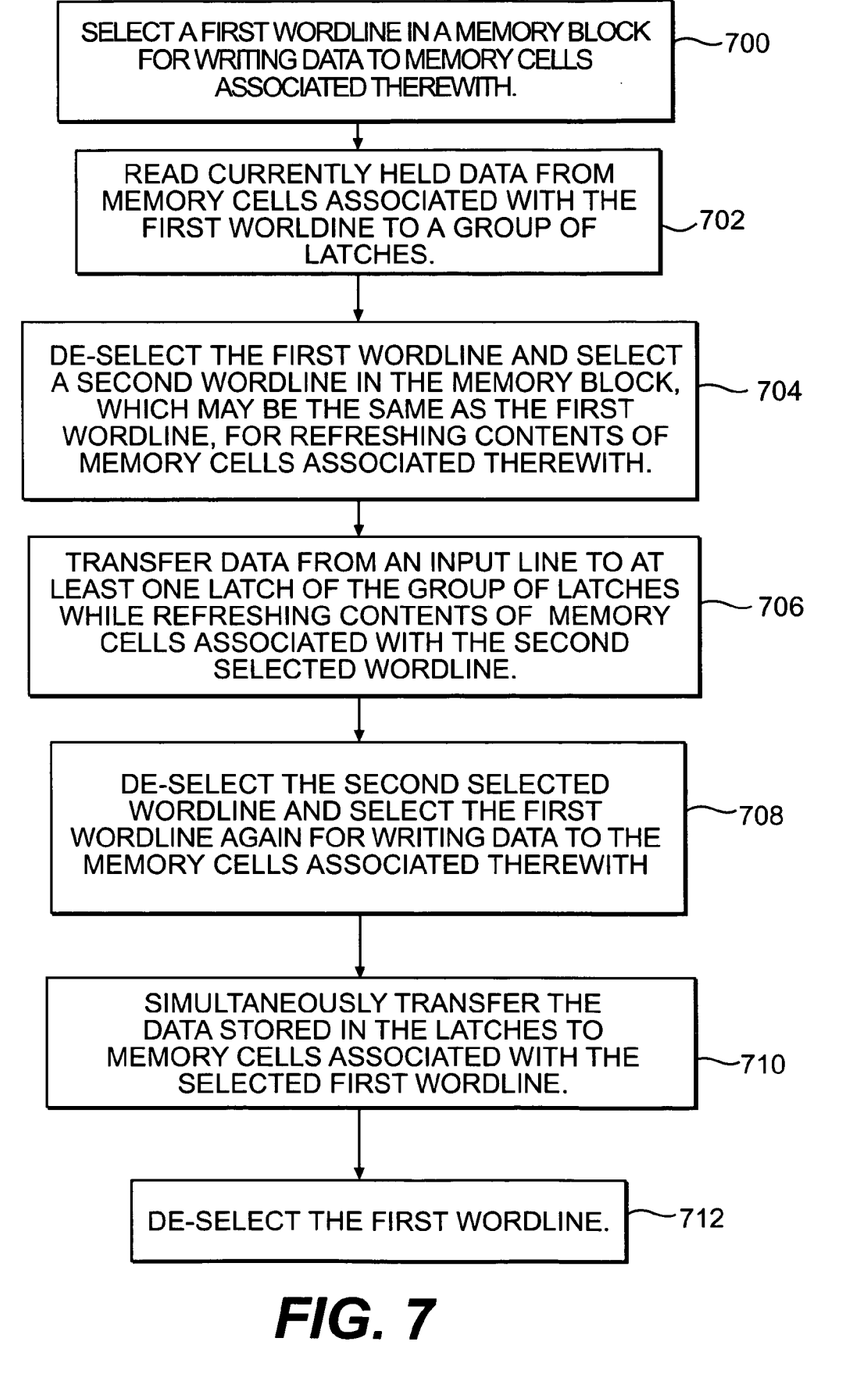
FIG. 7 is a flowchart illustrating a method for writing data to a memory device consistent with the present invention.

FIG. 7 is a flowchart illustrating a method consistent with the present invention for writing data to a memory block. In step 700, a first wordline in a memory block is selected for writing data to the memory cells associated therewith. In step 702, currently held data is read from the memory cells of the selected row to a group of latches. Refreshing of memory cells can be conducted during the sequence of operations required for writing data to a selected, e.g., the first wordline. Thus, in step 704, the first wordline is de-selected and the same wordline or a second wordline in the memory block is selected for refreshing contents of memory cells associated therewith. In step 706, data is transferred from an input line to at least one latch of the group of latches while the contents of the memory cells associated with the second wordline (which may be the same as the first wordline) are refreshed. In step 708, the second selected wordline (which may be the same as the first wordline), the associated memory cells of which have been refreshed, is de-selected and the first wordline is selected again for writing data to the memory cells associated therewith. In step 710, the data stored in the latches is simultaneously transferred to the memory cells associated with the selected first wordline. In step 712, the first wordline is de-selected.

Other embodiments of the invention will be apparent to those skilled in the art from consideration of the specification and practice of the invention disclosed herein. It is intended that the specification and examples be considered as exemplary only, with a true scope and spirit of the invention being indicated by the following claims.

What is claimed is:

1. A memory device comprising:
   a first memory block and a second memory block having memory cells arranged in rows and columns;
   a first selector coupled to the first memory block to select a row of the memory cells;
   a group of amplifiers coupled to the first memory block to at least one of read data from and write data to the selected row;
   a buffer, coupled to the group of amplifiers, comprising a plurality of latches having sufficient capacity to hold data corresponding to the selected row of memory cells, wherein a portion of the latches are shared between the first memory block and the second memory block; and
   a second selector for selectively activating one of a first bank of switches and a second bank of switches to associate the portion of the latches with one of the first memory block and the second memory block, respectively.

2. The memory device of claim 1, wherein the first selector is configured to select the row of memory cells only once during at least one of a read operation and a write operation carried out on the selected row.

3. The memory device of claim 1, wherein each said latch comprises a first port and a second port, the first port configured to carry the data associated with a corresponding one of the memory cells and the second port configured to carry a logical inverse of the data carried on the first port.

4. The memory device of claim 3, wherein:
   the latch further comprises a first inverter and a second inverter;
   the first port is applied to an input of the first inverter and to an output of the second inverter;
   the second port is applied to an output of the first inverter and to an input of the second inverter; and
   the output of the first inverter is applied to the input of the second inverter and the first port.

5. The memory device of claim 1, wherein:
   the amplifiers are arranged in a first bank of amplifiers and a second bank of amplifiers;
   the latches are arranged in a first bank of latches and a second bank of latches;
   the first bank of latches are coupled to the first bank of amplifiers;
   the first bank of amplifiers are coupled to alternate columns of the memory cells;
   the second bank of latches are coupled to the second bank of amplifiers; and
   the second bank of amplifiers are coupled to columns of the memory cells between the alternate columns to which the first bank of amplifiers are coupled.

6. The memory device of claim 1, wherein a number of the latches and a number of the amplifiers each corresponds to a number of the columns in the first memory block.

7. A memory device comprising:
   a first memory block and a second memory block having memory cells arranged in rows and columns;
   a first set of amplifiers coupled to the rows of memory cells in the first memory block to at least one of read data from and write data to the rows of memory cells;
   a buffer, coupled to the first set of amplifiers, comprising a plurality of latches to hold data corresponding to one of the rows of memory cells, wherein a portion of the latches are shared between the first memory block and the second memory block;
   a second set of amplifiers coupled to the buffer to at least one of read data from and write data to the buffer; and
   a selector for selectively activating one of a first bank of switches and a second bank of switches to associate the portion of the latches with one of the first memory block and the second memory block, respectively.

8. The memory device of claim 7, wherein:
   the first set of amplifiers are arranged in a first bank of amplifiers and a second bank of amplifiers;
   the latches are arranged in a first bank of latches and a second bank of latches;
   the first bank of latches are coupled to the first bank of amplifiers;
   the first bank of amplifiers are coupled to alternate columns of the memory cells;
   the second bank of latches are coupled to the second bank of amplifiers; and
   the second bank of amplifiers are coupled to columns of the memory cells between the alternate columns to which the first bank of amplifiers are coupled.

9. The memory device of claim 7, wherein a number of the latches and a number of the first set of amplifiers each corresponds to a number of columns in the first memory block.

10. A method of reading data from a first memory block and a second memory block having rows of memory cells for storing data and an output line, the method comprising:
    selecting a first one of the rows of memory cells;
    selectively activating one of a first bank of switches and a second bank of switches to associate a portion of a group of latches with one of the first memory block and the second memory block, respectively:
    transferring, in a single operation, the data stored in the selected first row of memory cells through a group of amplifiers to the group of latches; and
    holding the transferred data in the group of latches.

11. The method of claim 10, further comprising:
    de-selecting the first row of memory cells; and
    transferring the data held in the group of latches to the output line.

12. The method of claim 11, further comprising:
    selecting a second one of the rows of memory cells; and
    refreshing the contents of the memory cells in the selected second row of memory cells during the transferring of data held in the latches to the output line.

13. The method of claim 12, wherein the selected second row of memory cells is the first row of memory cells.

14. The method of claim 10, wherein the data stored in the selected first row of memory cells is transferred simultaneously to the group of latches.

15. A method of writing data to a first memory block and a second memory block having rows of memory cells for storing data and an input line, the method comprising:
   selecting a first one of the rows of memory cells to receive data;
   selectively activating one of a first bank of switches and a second bank of switches to associate a portion of a group of latches with one of the first memory block and the second memory block, respectively;
   reading currently held data from the memory cells of the selected first row to the group of latches;
   transferring data from the input line to at least one latch of the group of latches; and
   writing, in a single operation, the data held in the group of latches through a group of amplifiers to the selected first row of memory cells.

16. The method of claim 15, further comprising deselecting the first row of memory cells.

17. The method of claim 16, further comprising:
   selecting a second one of the rows of memory cells; and
   refreshing the contents of the selected second row of memory cells during the transferring of data from the input line to at least one latch of the group of latches.

18. The method of claim 17, wherein the selected second row of memory cells is the first row of memory cells.

19. The method of claim 15, wherein the data held in the group of latches is transferred simultaneously to the selected first row of memory cells.

20. The method of claim 15, wherein the transferring of data from the input line to at least one latch of the group of latches replaces at least a portion of the data read from the memory cells to the group of latches with the data from the input line.

* * * * *